United States Patent [19]

Toyooka et al.

[11] Patent Number: 5,023,473
[45] Date of Patent: Jun. 11, 1991

[54] DRIVE CIRCUIT FOR BLOCH LINE MEMORY

[75] Inventors: Takashi Toyooka, Sayama; Yoji Maruyama, Iruma; Ryo Suzuki, Hachioji, all of Japan

[73] Assignee: Hitachi, Ltd., Tokyo, Japan

[21] Appl. No.: 593,375

[22] Filed: Oct. 1, 1990

Related U.S. Application Data

[63] Continuation of Ser. No. 274,894, Nov. 22, 1988, abandoned.

[30] Foreign Application Priority Data

Nov. 22, 1987 [JP] Japan .................................. 62-297750

[51] Int. Cl.⁵ ............................................... H03K 3/01
[52] U.S. Cl. .................................... 307/270; 307/282; 361/152; 365/7
[58] Field of Search ............... 365/6, 7; 307/270, 314, 307/282, 292, 412, 296.1-296.4; 361/152, 153

[56] References Cited

U.S. PATENT DOCUMENTS

| | | | |
|---|---|---|---|
| 3,958,160 | 5/1976 | de Niet et al. | 365/6 |
| 4,106,088 | 8/1978 | Bergan | 365/6 |
| 4,224,535 | 9/1980 | Wilson et al. | 307/270 |
| 4,250,564 | 2/1981 | Takahashi | 365/6 |
| 4,337,250 | 6/1982 | Judd et al. | 365/6 |
| 4,635,226 | 1/1987 | Takahashi et al. | 365/6 |

FOREIGN PATENT DOCUMENTS

0179619 7/1988 Japan .................................. 307/270

Primary Examiner—Stanley D. Miller
Assistant Examiner—T. Cunningham
Attorney, Agent, or Firm—Pennie & Edmonds

[57] ABSTRACT

This invention accomplishes low power consumption by a drive circuit for a Bloch line memory, which includes a power source, a bias magnetic field coil, a plurality of switching means and means for returning the power supplied to the bias magnetic field to the power source. The present invention can set the waveform of a pulse current (coil current) to a desired waveform by particularly using a transformer, and can improve the transfer characteristics of the Both line pair.

31 Claims, 4 Drawing Sheets

DRIVE CIRCUIT FOR BLOCH LINE MEMORY

This is a continuation of application Ser. No. 274,894, filed Nov. 22, 1988, now abandoned.

BACKGROUND OF THE INVENTION

(1) Field of the Invention

This invention relates to a drive circuit for a Bloch line memory. More particularly, the present invention relates to a drive circuit which drives a Bloch line memory by a bias magnetic field pulse. The drive circuit for a Bloch line memory in accordance with the present invention can be applied to drive circuits for the Bloch line memory used as a memory of computers and various communication equipment besides data terminals, POS terminals, word processors, NC machines, various measuring instruments, and the like.

(2) Description of the Prior Art

In comparison with conventional magnetic bubble memories, a Bloch line memory is a solid-state magnetic memory that can increase 30 to 100 times the memory density. Whereas the magnetic bubble memory stores the logic "1" or "0" of data in correspondence to the existence or absence of a magnetic bubble in a magnetic thin film, the Bloch line memory uses as its data carrier a Bloch line pair that exists in the domain wall of a stripe domain corresponding to the stretched bubble.

The Bloch line memory is, in principle, a shift register type memory in the same way as the magnetic bubble memory. Therefore, the Bloch line pair as the data carrier is necessary to propagate inside the domain wall. The Bloch line pair is propagated by applying a pulsed bias magnetic field to the stripe domain, which causes the domain wall move and results through the gyro effect the transverse propagation of the Bloch line pair along the domain wall. The wave form of the pulsed bias magnetic field was contrived to provide the transverse propagation in one direction.

A pulse bias magnetic field having a rise time of 50 to 100 ns, a fall time of 300 ns to 2 μs and an amplitude of 5 to 10 Oe is employed to propagate the Bloch line pair. The propagation of the Bloch line pair in one direction is realized by the different pulse rise time from the pulse fall time.

An example of a memory module generating such a pulse bias magnetic field is described in the resume of 8th Meeting of Japan Applied Magnetism Society, Nov. 1984, p. 94. The outline of the memory module will be described with reference to FIG. 3 of the accompanying drawings.

A bias magnetic field pulse is generated by using a magnetic circuit having a cross-sectional view such as shown in the drawing. Rectangular magnetic plates 32 and 33 are placed above and below a Bloch line memory device 31 and they are surrounded by a shield case 34. Bias magnetic field coils 35 and 36 are wound around the side surfaces of the rectangular magnetic plates 32 and 33, respectively. A current pulse (amplitude: approx. 0.2 to 2 A, rise time: 50 to 100 ns, fall time: 300 ns to 2 μs) having a waveform 41 as shown in FIG. 4 is supplied to the bias field coils 35 and 36 to generate the pulsed bias magnetic field described above.

An example of a drive circuit for the pulsed bias magnetic field of such a memory module is disclosed in Japanese Patent Laid-Open No. 207011/1984. As shown in FIG. 5, when a first switching element 51 is turned on, a pulsed current is supplied to a bias field coil 53 from a D.C. constant voltage source 52-1. The pulsed current amplitude $i_L(t)$ is given by the formula (1) below with $E_{s1}$ representing the voltage of the D.C. constant voltage source 52-1 and $E_T$ representing the ON voltage of the switching element 51:

$$i_L(t) = \frac{E_{s1} - E_T}{L} \cdot t \quad (1)$$

Next, when the first switching device 51 is turned off, the second switching device 54 is turned on at $t=\tau_1$. Then the pulsed current flows from the D.C. constant voltage source 52-1 to the D.C. constant voltage source 52-2 through the coil 53, the second switching device 54 and a resistor 55. The pulsed current amplitude at $\tau_1 \leq t \leq \tau_2$ is given by the formula (2) below with $E_{s2}$ representing the voltage of the D.C. constant voltage source 52-2 and $E_T$ representing the ON voltage of the first and second switching device 51 and 54.

$$i_L(t) = \frac{(E_{s1} - E_T)}{L} \cdot \tau_2 - \frac{(E_{s2} - E_{s1} + E_T)}{L}(t - \tau_2) \quad (2)$$

Here, $\rho_2$ is given by the formula (3) below:

$$\tau_2 = \frac{E_{s2}}{E_{s2} - E_{s1} + E_T} \tau_1 \quad (3)$$

Therefore, the pulsed current waveform through the bias field coil driven by the drive circuit becomes as shown in FIG. 6. In the drive circuit, the power loss of the switching devices 51 and 54 is small.

However, the inventors of the present invention realized that power consumption in the drive circuit is impractically large. The following technical problems are yet left unsolved. The drive circuit shown in FIG. 5, the pulsed current flows from the D.C. constant voltage source 52-1 to the bias field coil 53 during $0 \leq t \leq \tau_1$. The pulsed current flows from the D.C. constant voltage source 52-1 to the D.C. constant voltage source 52-2 through the bias field coil 53, the switching device 54 and the resistor 55 during $\tau_1 \leq t \leq \tau_2$. Therefore, the current is supplied from the D.C. constant voltage source 52-1 and is absorbed by the D.C. constant voltage source 52-2. If the memory device to be driven is about 15 mm square, the volume of the portion of the memory module shown in FIG. 3 to which the magnetic field is to be applied is 20 mm×20 mm×3 mm which is approx. $1.2 \times 10^{-6}$ m$^3$. The inductance of the coil is about 1 μH if a bias magnetic field pulse having an amplitude of 10 Oe is supplied by the coil current amplitude of 1 A. With the pulse amplitude of the current pulse of 1 A, the rise time of 50 ns, the fall time of 500 ns and the repetition period of 1 MHz, the voltage of the power source 52-1 of 20 V and that of the power source 52-2 of 22 V are necessary. The power consumption of the power source 52-1 is 5.3 W and that of the power source 52-2 is 5.5 W. To reduce the power consumption, a circuit 50 for returning the current absorbed by the power source 52-2 to the power source 52-1 may be added. However, the addition of such a circuit results in the increase in the number of circuit components and in a more complicated circuit configuration.

SUMMARY OF THE INVENTION

In accordance with one aspect of the present invention, there is provided a drive circuit for a Bloch line memory which comprises a bias magnetic field coil for generating a pulsed bias magnetic field; a power source for supplying a pulsed current to the bias magnetic field coil; means for returning the pulsed current to the power source; a first current path having first switching means for supplying the pulsed current from the power source to the bias magnetic field coil; a second current path including second switching means for supplying the pulsed current from the bias magnetic field coil to the returning means; and a third current path having third switching means for supplying the pulse current from the returning means to the power source. Such a drive circuit includes a closed loop for circulating part of the current (or power) supplied from the power source to the power source. The bias magnetic field pulse can be generated with low power consumption by the first, second and third current paths described above.

In accordance with a limited aspect of the present invention, there is provided a drive circuit for a Bloch line memory wherein the returning means described above is a pulse transformer. The pulse transformer includes a primary winding and a secondary winding. The ratio of the rise time to the fall time of the pulse current can be selected arbitrarily by selecting the ratio of the second winding number to the first winding number of the pulse transformer. Therefore, a desired drive circuit can be obtained easily in accordance with the characteristics of the Bloch line memory to be driven.

In accordance with a more limited aspect of the present invention, there is provided a drive circuit for a Bloch line memory wherein the second and the third switching means described above are diodes. Since the second and third switching means are automatically synchronized to the first switching means by the circuit arrangement, the driving frequency can be enlarged and a Bloch line memory can be driven at a higher speed.

In accordance with a more limited aspect of the present invention, there is provided a drive circuit for a Bloch line memory, wherein the first current path includes two first switching means interposing the bias magnetic field coil between them and the second current path includes two second switching means interposing the bias magnetic field coil between them. According to the structure, a pulsed current having a shape suitable for improving the characteristics of a Bloch line memory can be generated by operating the two first switching means at different ON/OFF timings.

In accordance with another aspect of the present invention, there is provided a drive circuit for a Bloch line memory, which comprises a bias magnetic field coil for generating a pulsed bias magnetic field; a power source for supplying a pulsed current to the bias magnetic field coil; means for returning the pulsed current to the power source; and a closed current path for returning a part of the supplied power of the coil from the power source back to the power source. Such a drive circuit includes first switching means for supplying the pulsed current from the power source to the bias magnetic field coil. In accordance with still another aspect of the present invention, there is provided a drive circuit which comprises a first current path including first switching means for supplying a pulsed current from a power source to a bias magnetic field coil only for a first period; a second current path including second switching means for passing the pulse current from the bias magnetic field coil to the primary winding of a pulse transformer only for a second period; and a third current path including third switching means for passing the pulse current from the secondary winding of the pulse transformer to the power source only for the second period. Such a drive circuit includes a saturation switch at the switching means and a D.C. constant voltage source as the power source. According to the circuit arrangement, the bias magnetic field coil of a Bloch line memory device can be driven at low power consumption. The power consumption of the drive circuit can be drastically reduced to 1/20 to 1/30 of that of a constant current drive circuit.

One of the advantages of the present invention resides in that there is provided a drive circuit wherein a Bloch line memory can be driven at sufficiently low power consumption even when the power consumption including the power source is taken into consideration.

Another advantage of the present invention resides in that there is provided a practical drive circuit which has a simplified structure and can be driven by a single power source.

Still further advantages of the present invention will become more apparent to those skilled in the art upon reading and understanding the following detailed description of the preferred embodiment.

BRIEF DESCRIPTION OF THE DRAWINGS

The present invention may take forms in various parts and arrangements of parts. The drawings are only for the purpose of illustrating the preferred embodiments and are not to be construed as limiting the invention.

DESCRIPTION OF THE PREFERRED EMBODIMENTS

Figure 1:
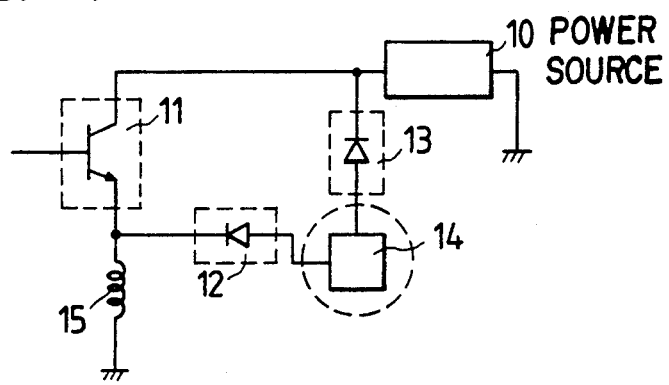
FIG. 1 is a circuit diagram useful for explaining the basic structure of a drive circuit in accordance with the present invention.

The basic structure and operation of the drive circuit in accordance with the present invention will be described with reference to FIG. 1. A pulsed bias magnetic field for propagating a Bloch line pair is generated by a pulsed current flowing through a bias magnetic field coil 15. The pulsed current is supplied from a power source 10. First switching means 11 for supplying the pulsed current to the bias magnetic field coil 15 is disposed on a first current path from the power source 10 to the bias magnetic field coil 15. The first switching means may include a bipolar or field effect transistor. Furthermore, second switching means is disposed on a second current path extending from the bias magnetic field coil 15 to means for returning the pulsed current to the power source. The second current path moves the energy stored in the bias magnetic field coil 15 to the returning means 14. The second switching means 12 may include a rectifier device such as a diode. Third switching means is disposed on a third current path from the feedback means to the power source. The above is the fundamental structure of the drive circuit in accordance with the present invention.

Next, the detailed operation of the circuit will be described. When the first switching means 11 is turned ON, a voltage is applied across the bias magnetic field coil 15. The voltage is the difference $E_s-E_T$ obtained by subtracting the ON voltage $E_T$ of the first switching means 11 from the voltage $E_s$ of the D.C. constant voltage source 10. The current (pulsed current or coil current) of the bias magnetic field coil 15 will be called $i_L(t)$ where t is zero (0) when the first switching means 11 is turned ON. Then, $i_L(t)$ at this time is given by the following formula (4);

$$i_L(t) = \frac{E_s - E_T}{L} \cdot t \tag{4}$$

where L: inductance of bias magnetic field coil 15. If the first switching means 11 is turned OFF at $t=t_1$, the coil current amplitude $i_{LP}$ at the time of $t_1$ is given by the following formula (5):

$$i_{LP} = \frac{E_s - E_T}{L} \cdot t_1 \tag{5}$$

When $t>t_1$, the coil current flows through the second current path. In other words, it flows into the means 14 for returning the pulse current from the bias magnetic field coil 15 through the second switching means 12. The pulsed current returning means 14 feeds back either directly or indirectly the inflowing pulse current to the power source 10. One preferred form of the means will be next given.

Figure 2:
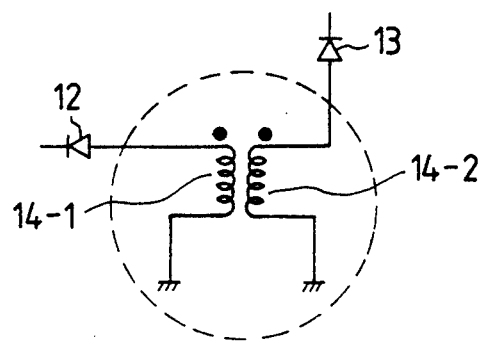
FIG. 2 is a circuit diagram useful for explaining returning means in the drive circuit in the first embodiment of the present invention.
Figure 3:
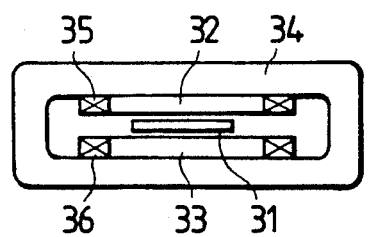
FIG. 3 is a schematic view useful for explaining a Bloch memory module.
Figure 4:
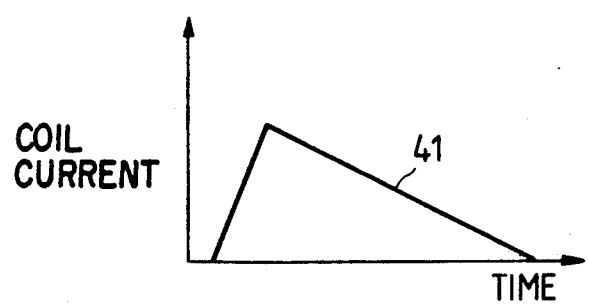
FIG. 4 is a diagram useful for explaining substantially the shape of a pulsed current used for generating a pulsed bias magnetic field for transferring a Bloch line pair in a Bloch line memory.

An example of the means for returning the pulsed current that can be employed in the present invention will be described with reference to FIG. 2, which illustrates the portion of FIG. 1 represented by broken line with the other portions being omitted. The drawing illustrates an example using a pulse transformer as the means for returning the pulsed current. The pulsed current from the bias magnetic field coil explained with reference to FIG. 1 flows in this case through the primary winding 14-1 of the pulse transformer. The flow of the primary induces current a secondary winding current of the pulse transformer to the D.C. constant voltage source 10 through the secondary winding 14-2 and the third switching means 13. Therefore, the voltage $E_L$ induced across both ends of the bias field coil is given by the following formula (6) when the ratio of number of windings of the secondary winding 14-2 of the pulse transformer to its primary winding 14-1 is 1:$\beta$ and the ON voltage of the second and third switching means 12, 13 is $E_T$:

$$E_L = E_T + \frac{1}{\beta}(E_s + E_T) \tag{6}$$

When $t>t_1$, the coil current $i_L(t)$ is given by the following formula (7):

$$i_L(t) = \frac{-E_L}{L}(t - t_1) + \frac{E_s - E_T}{L} t_1 \tag{7}$$

Therefore, the time change of $i_L(t)$ when $t>t_1$ is given by $-E_s/\beta L$ if $E_s>>E_T$. The time change of $i_L(t)$ when $0<t<t_1$ is given by $E_s/L$ from the formula (4) if $E_s>>E_T$.

As a result, the absolute value of the time change of the coil current at the fall can be made substantially to $1/\beta$ of the time change of the coil current at the time of the rise. In other words, the fall time of the coil current can be made to be $\beta$ times the rise time.

This means that the fall time can be selected arbitrarily by selecting the ratio of the number of the primary windings to secondary windings. Hereinafter, the present invention will be described in further detail with reference to preferred embodiments thereof.

Embodiment 1

Figure 7:
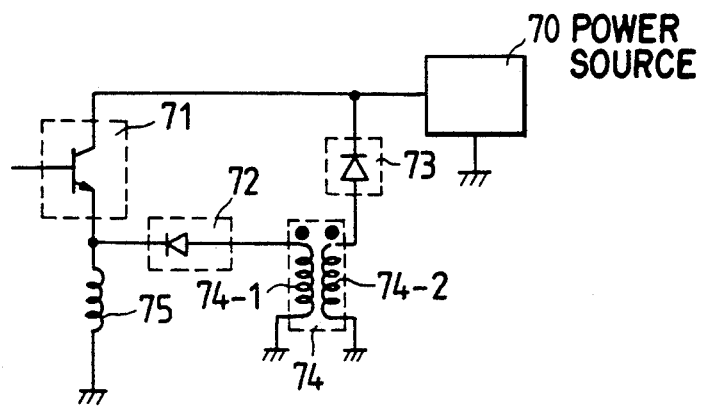
FIG. 7 is a circuit diagram useful for explaining the drive circuit in accordance with one embodiment of the present invention, suggesting the forms of second and third switching means and illustrating the case where a transformer is used as returning means for returning a pulsed current to a power source.

The first embodiment of the present invention will be described with reference to FIG. 7 and 8. In this embodiment, the first switching means 71 consists of a switching transistor while the second and third switching means 72, 73 consist of diodes, respectively. The operation of the embodiment will be described with reference to FIG. 8.

The power source 70 and the bias magnetic field coil 75 are connected to each other by turning ON the first switching means 71. During the period of $t=0\sim t_1$ while the first switching means 71 is turned ON, the coil current increases in accordance with the formula (4). In the period the electric power is supplied from the power source 70 to the coil 75. When the first switch 71 is turned OFF at $t=t_1$, the current flowing through the bias magnetic coil 75 then flows through the second switch 72 and the primary winding 74-1 of the transformer 74. Accordingly, the current induced in the secondary winding 74-2 of the transformer 74 flows to the power source 70 through the third switch 73. During the period the energy of the coil 75 returns to the power 70 through the transformer 74. Accordingly, the coil current decreases as represented by 81 in FIG. 8 and as expressed by the formula (7). The coil current becomes zero (0) when the energy of the coil 75 becomes zero at $t=t_2$.

Figure 5:
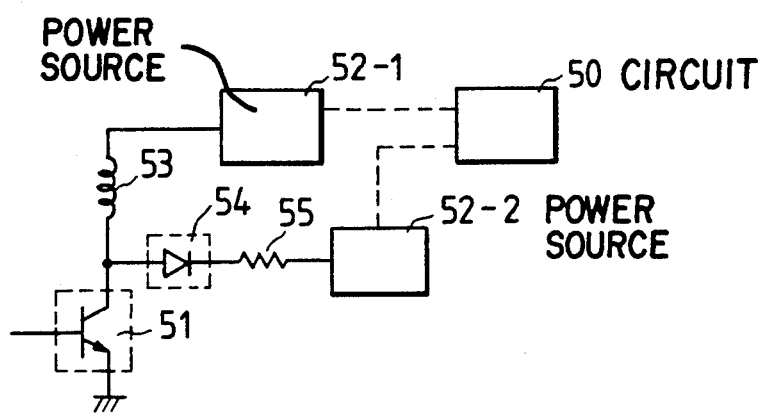
FIG. 5 and 6 are a circuit diagram and a diagram useful for explaining the structure of a conventional drive circuit and its pulsed current.
Figure 6:
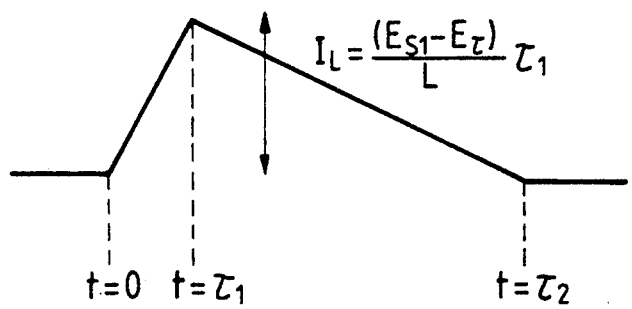

In the operation described above, the semiconductor devices constituting the switches 71–73 forming the current flow paths are at the saturation operation points and hence their consumed power is extremely small. If the coil 75 described above is operated at the rise time of 50 ns and the fall time of 500 ns in the same way as described already, the coil current amplitude is 0.5 A, the ON voltage of the first switching means 71 is 0.5 V and the ON voltage of the switching means 72, 73 is 0.8 V, where the winding ratio $\beta$ of the transformer 74 is 10. Assuming that the consumed power in the transformer 74 under this condition is sufficiently small, the consumed power of the drive circuit inclusive of the power source is 0.186 W on an average, where Q of the coil is assumed to be 10. This means that in comparison with the conventional drive circuit (FIG. 5), the consumed power can be reduced to about 1/30.

Embodiment 2

Figure 9:
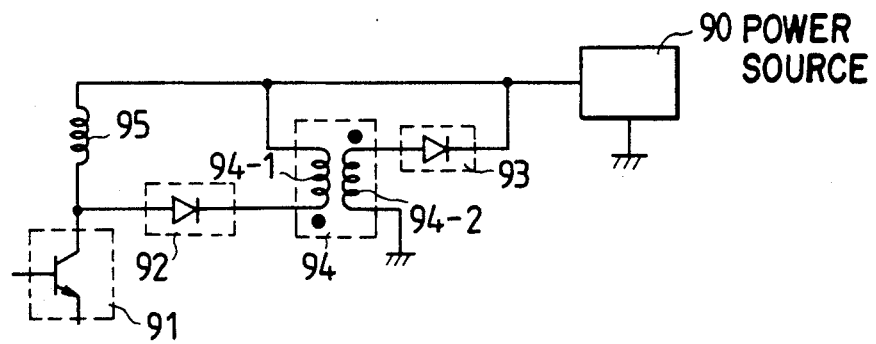
FIG. 9 is a circuit diagram useful for explaining the drive circuit in accordance with another embodiment of the present invention, wherein one of the terminals of the first switching means is connected to the ground.

The second embodiment of the present invention will be described with reference to FIG. 9. In this embodiment one of the terminals of the first switching means 91 is connected to the ground side of the bias magnetic field coil 95 and the other end of this coil 95 is connected to the power source 90. The series circuit of the second switch 92 and the primary winding 94-1 of the transformer 94 is connected in parallel with the coil 95 in the same way as in the first embodiment. The secondary winding 94-2 of the transformer 94 is connected to the power source 90 through the third switching means 93 in the same way as in the first embodiment.

In comparison with the first embodiment, the second embodiment provides the advantages in that the consumed power is substantially the same and since one of the terminal of the first switching means 91 can be grounded, the first switching means 91 can be controlled easily.

Embodiment 3

Figure 10:
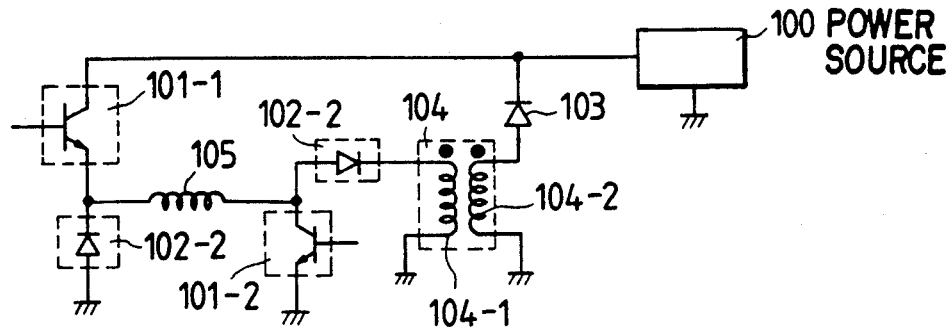
FIG. 10 is a circuit diagram useful for explaining the drive circuit in accordance with still another embodiment of the present invention, wherein the different wave form of the bias field coil from the above mentioned circuits.

The third embodiment of the present invention will be described with reference to FIGS. 10 and 11. In this embodiment the first switching means 101 is divided into 101-1 and 101-2 and each consists of a switching transistor. The second switching means 102 is also divided into 102-1 and 102-2 and each consists of a diode. The transformer 104 and the third switching means 103 are the same as those of the first embodiment.

Figure 8:
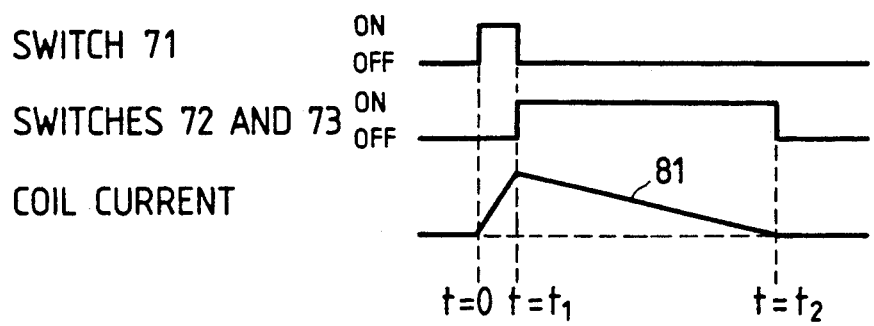
FIG. 8 is a diagram useful for explaining ON/OFF timing of each switching means for operating the embodiment shown in FIG. 7 and showing an example of the waveform of a coil current generated thereby.

The first operation of this embodiment is the same as that of the first embodiment as shown in FIG. 8. The switching means 101-1, 101-2 and the switching means 102-1, 102-2 are turned ON and OFF simultaneously, respectively. In the operation, since the number of switching devices constituting the switching means 101, 102 increases, the consumed power is greater by about 50% than that of the first and second embodiments.

Figure 11:
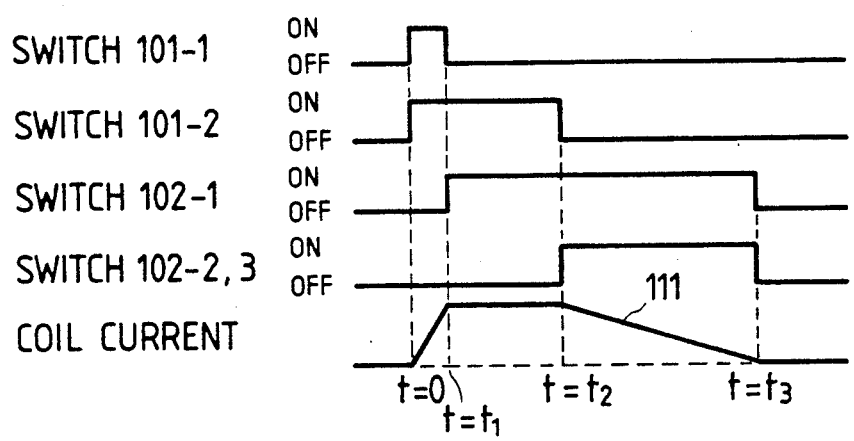
FIG. 11 is a diagram showing an example of the operation of the embodiment shown in FIG. 10.

However, the operation shown in FIG. 11 is possible in this embodiment. Namely, at $t=0$, the switching means 101-1 and the switching means 102-1 are simultaneously turned ON and at $t=t_1$, the coil current is increased to a predetermined amplitude. When $t=t_1$, only the switching means 101-1 is turned OFF. Since the switching means 102-1 is ON at this time, there is formed a current path ranging from the switching means 102-1, the bias magnetic field coil 105 and the switching means 101-2. The voltage across both ends of the bias magnetic field coil 105 is the sum of the ON voltage of the switching means 102-1 and switching means 101-2 and is as small as about 1.3 V. Therefore, during the period of $t_2 < t < t_1$ which is some dozens to several hundreds of ns, the current of the bias magnetic field coil 105 is substantially constant. When switching means 101-2 is turned OFF at $t=t_2$, there is formed a current path ranging from the switching means 102-1, the bias magnetic field coil 105, the switching means 102-2 and the primary winding 104-1 of the transformer 104 and the energy of the bias magnetic field coil 105 returns to the D.C. constant voltage source 100 in the same way as in the first and second embodiments. The current of the bias magnetic field coil 105 decreases and becomes zero when $t=t_3$.

The waveform of the bias magnetic field pulse can be changed from the triangular wave to the trapezoidal wave by use of the circuit construction of this embodiment and the driving characteristics of the Bloch line can be improved by use of the waveform.

Although the present invention has thus been described with reference to the drive circuit for a Bloch line memory which has a transformer as means for returning the pulsed current from the bias field coil to the source, it is to be appreciated that other means for returning are applicable, and the transformer may be replaced by such means.

Although the present invention has thus been described with reference to some preferred embodiment thereof, various modifications and alterations will obviously occur to those of ordinary skills in the art upon reading and understanding the present specification. It is intended therefore that the present invention to construed as including all such modifications and alterations in so far as they come within the scope of the appended claims or the equivalent thereof.

What is claimed is:

1. A drive circuit for a Bloch line memory, comprising:
   a bias magnetic field coil for generating a pulsed bias magnetic field;
   a source for supplying a pulsed current to said bias magnetic field coil;
   means for returning the pulsed current from the bias magnetic field coil to said source;
   a first current path electrically connecting the source, the bias magnetic field coil and a first switching means for supplying the pulsed current from said source to said bias magnetic field coil;
   a second current path electrically connecting the bias magnetic field coil, the returning means and a second switching means for returning the pulsed current from said bias magnetic field coil to said returning means; and
   a third current path electrically connecting the returning means, the source and a third switching means for returning the pulsed current from said returning means to said source.

2. The drive circuit as set forth in claim 1, wherein said returning means is a transformer.

3. The drive circuit as set forth in claim 2, wherein said transformer has a primary winding and a secondary winding, and the ratio $\beta$ of the secondary winding number to the primary winding number is set to a desired value so that the ratio of the fall time of the pulsed current to the rise time is substantially $1/\beta$.

4. The drive circuit as set forth in claim 3, wherein said $\beta$ value is 2 to 20.

5. The drive circuit as set forth in claim 1, wherein said third switching means is a diode.

6. A drive circuit for a Bloch line memory, comprising:
   a bias magnetic field coil for generating a pulsed bias magnetic field;

a source for supplying a pulsed current to said bias magnetic field coil;

means for returning the pulsed current from the bias magnetic field coil to said source; and a closed current path electrically connecting the bias magnetic field coil, the source and the means for returning so as to return a part of the pulsed current from the bias magnetic field to said source.

7. The drive circuit as set forth in claim 6, further including first switching means for supplying the pulsed current from said source to said bias magnetic field coil.

8. A drive circuit for a Bloch line memory, including a bias magnetic field coil, a D.C. constant voltage source, a pulse transformer and a first, a second and a third switching devices, so as to drive said bias magnetic field coil with bias magnetic field pulses, said drive circuit comprising:

a first current including said first switching device for a pulsed current to flow from said D.C. power source to said bias magnetic field coil only for a first period;

said second current path including a second switching device for the pulsed current to flow from said bias magnetic field coil to a primary winding of said pulse transformer only for a second period; and a third current path including said third switching device for the pulsed current to flow from a secondary winding of said pulse transformer to said D.C. constant voltage source only for said second period.

9. A drive circuit for a Bloch line memory including a bias magnetic field coil, a D.C. constant voltage source, a pulse transformer and a first, a second, a third, a fourth and fifth switching devices, so as to drive said bias magnetic field coil using magnetic field pulses, said drive circuit comprising:

a first current path electrically connecting the D.C. constant voltage source, the bias magnetic field coil, the first and the second switching devices for a pulsed current to flow from said D.C. constant power source to said bias magnetic field coil only for a first period;

a second current path electrically connecting the bias magnetic field coil, said second switching device and said third switching device connected to both ends of said bias magnetic field coil and causing the pulsed current to flow through said bias magnetic field coil only for a second period by electrically connecting both ends of said bias magnetic field coil;

a third current path electrically connecting the bias magnetic field coil, a primary winding of the pulse transformer, said third switching device and said fourth switching device for the pulsed current to flow from said bias magnetic field coil to the primary winding of said pulse transformer only for a third period; and a fourth current path electrically connecting a secondary winding of the pulse transformer, the D.C. constant voltage source and said fifth switching device for causing the pulsed current to flow from the secondary winding of said pulse transformer to said power source only for said third period.

10. A drive circuit for a Block line memory chip comprising:

a bias magnetic field coil for generating a pulsed bias magnetic field to said bloch line memory chip by a pulsed current through said bias magnetic field coil, said pulsed current having first and second contiguous time segments;

a constant voltage source supplying said pulsed current to said bias magnetic field coil;

a current returning means for returning said pulsed current from the bias magnetic field coil to said constant voltage source;

a first switching means which switches to establish a first path for said pulsed current for the duration of said first time segment, said first path comprising a series connection of said constant voltage source, said bias magnetic field coil and said first switching means, said first path being established while an amplitude of said pulsed current increases from a substantially zero value at the beginning of said first time segment to a second amplitude value at the end of said first time segment;

a second switching means which switches to establish a second path for said pulsed current for the duration of said second time segment, said second path comprising a series connection of said bias magnetic field coil, said second switching means and a first part of said current returning means;

a third switching means which switches to establish a third path for said pulsed current for the duration of said second time segment, said third current path comprising a series connection of said bias magnetic field coil, said third switching means and a second part of said current returning means, said second and third current paths being established while an amplitude of said pulsed current decreases from said second amplitude value at the beginning of said second time segment to a substantially zero value at the end of said second time segment.

11. A drive circuit for a Bloch line memory according to claim 8, wherein said current returning means is a transformer.

12. A drive circuit for a Bloch line memory according to claim 11, wherein said first part of said current returning means is a primary winding of said transformer and said second part of said current returning means is a secondary winding of said transformer.

13. A drive circuit for a Bloch line memory according to claim 12, wherein a ratio B of the secondary winding number to the primary winding number in said transformer is set to a desired value so that the ratio of said second time segment to said first time segment of said pulsed current is approximately B.

14. A drive circuit for a Bloch line memory according to claim 13, wherein said B value is 2 to 20.

15. A drive circuit for a Bloch line memory according to claim 8, wherein said first switching means includes either a bipolar transistor or a field effect transistor.

16. A drive circuit for a Bloch line memory according to claim 8, wherein at least one of said second and third switching means is a diode.

17. A drive circuit for a Bloch line memory according to claim 8, wherein a terminal of said first switching means is connected to a ground potential of said Bloch line memory chip.

18. A drive circuit for a Bloch line memory chip comprising:

a bias magnetic field coil for generating a pulsed bias magnetic field to said Bloch line memory chip by a pulsed current through said bias magnetic field coil, said pulsed current having contiguous first, second and third time segments;

a constant voltage source supplying said pulsed current to said bias magnetic field coil;

a current returning means for returning said pulsed current from the bias magnetic field coil to said constant voltage source;

a first switching means, composed of a first portion and a second portion, said first switching means switching to establish a first current path for said pulsed current for the duration of said first time segment, said first current path comprising a series connection of said constant voltage source, said bias magnetic field coil and said first and said second portions of said first switching means, said first pulsed current path being established while an amplitude of said pulsed current increases from a substantially zero value at the beginning of said first time segment to a second value at the end of said first time segment;

a second switching means which switches to establish a second current path for said pulsed current for the duration of said second time segment, said second path comprising a series connection of said second portion of said first switching means, said bias magnetic field coil and said second switching means, said second portion of said first switching means switching during said second time segment so as to be included in said second current path, and said second pulsed current path being established while an amplitude of said pulsed current is substantially constant and equal to said second amplitude value for the duration of said second time segment;

a third switching means which switches to establish a third current path for said pulsed current for the duration of said third time segment, said third path comprising a series connection of said second switching means, said bias magnetic field coil, said third switching means and a first part of said current returning means, said third switching means switching during said third time segment so as to be included in said third path;

a fourth switching means which switches to establish a fourth current path for said pulsed current for the duration of said third time segment, said fourth path comprising a series connection of said fourth switching means, a second part of said current returning means and said constant voltage source, said third and fourth pulsed current paths being established while an amplitude of said pulsed current decreases from said second amplitude value at the beginning of said third time interval to a substantially zero value at the end of said third time segment.

19. A drive circuit for a Bloch line memory according to claim 18, wherein said current returning means is a transformer.

20. A drive circuit for a Bloch line memory according to claim 19, wherein said first part of said current returning means is a primary winding of said transformer and said second part of said current returning means is a secondary winding of said transformer.

21. A drive circuit for a Bloch line memory according to claim 20, wherein a ratio B of the secondary winding number to the primary winding number in said transformer is set to a desired value so that the ratio of said third time segment to said first time segment is approximately B.

22. A drive circuit for a Bloch line memory according to claim 21, wherein said B value is 2 to 20.

23. A drive circuit for a Bloch line memory according to claim 18, wherein said first switching means includes either a bipolar transistor or a field effect transistor.

24. A drive circuit for a Bloch line memory according to claim 18, wherein at least one of said second and third switching means is a diode.

25. A drive circuit for a Bloch line memory chip comprising:

a bias magnetic field coil for generating a pulsed bias magnetic field to said Bloch line memory chip by a pulsed current through said bias magnetic field coil, said pulsed current having contiguous first, second time segments;

a constant voltage source supplying said pulsed current to said bias magnetic field coil;

a current returning means for returning said pulsed current from the bias magnetic field coil to said constant voltage source;

a first switching means, composed of a first portion and a second portion, which switches to establish a first current path for said pulsed current for the duration of said first time interval, said first path comprising a series connection of said constant voltage source, said bias magnetic field coil and said first and said second portions of said first switching means, said first path being established while an amplitude of said pulsed current increases from a substantially zero value at the beginning of said first time segment to a second amplitude value at the end of said first time segment;

a second switching means, composed of a first portion and a second portion, which switches to establish a second current path for said pulsed current for the duration of said second time segment, said second path comprising a series connection of said first and said second portions of said second switching means, said bias magnetic field coil and a first part of said current returning means;

a third switching means which switches to establish a third current path for said pulsed current for the duration of said second time segment, said third path comprising a series connection of said third switching means, a second part of said current returning means and said constant voltage, said second path and said third path for said pulsed current being established while an amplitude of said pulsed current decreases from said second amplitude value at the beginning of said second time segment to a substantially zero value at the end of said second time segment.

26. A drive circuit for a Bloch line memory according to claim 25, wherein said current returning means is a transformer.

27. A drive circuit for a Bloch line memory according to claim 26, wherein said first part of said current returning means is a primary winding of said transformer and said second part of said current returning means is a secondary winding of said transformer.

28. A drive circuit for a Bloch line memory according to claim 27, wherein a ratio B of the secondary winding number to the primary winding number in said transformer is set to a desired value so that the ratio of said second time segment to said first time segment is approximately B.

29. A drive circuit for a Bloch line memory according to claim 18, wherein said B value is 2 to 20.

30. A drive circuit for a Bloch line memory according to claim 25, wherein said first switching means includes either a bipolar transistor or a field effect transistor.

31. A drive circuit for a Bloch line memory according to claim 25, wherein at least one of said second and third switching means is a diode.

* * * * *